(12) United States Patent
Spring et al.

(10) Patent No.: US 11,937,517 B2
(45) Date of Patent: Mar. 19, 2024

(54) SUPERCONDUCTING QUANTUM COMPUTING CIRCUIT PACKAGE

(71) Applicant: Oxford University Innovation Limited, Oxford (GB)

(72) Inventors: Peter Spring, Oxford (GB); Peter Leek, Oxford (GB)

(73) Assignee: OXFORD UNIVERSITY INNOVATION LIMITED (GB)

(\*) Notice: Subject to any disclaimer, the term of this patent is extended or adjusted under 35 U.S.C. 154(b) by 408 days.

(21) Appl. No.: 17/267,057

(22) PCT Filed: Aug. 13, 2019

(86) PCT No.: PCT/GB2019/052271
§ 371 (c)(1),
(2) Date: Feb. 9, 2021

(87) PCT Pub. No.: WO2020/035672
PCT Pub. Date: Feb. 20, 2020

(65) Prior Publication Data
US 2021/0296559 A1 Sep. 23, 2021

(30) Foreign Application Priority Data
Aug. 13, 2018 (GB) ...................... 1813188

(51) Int. Cl.
*G06N 10/00* (2022.01)
*H10N 60/12* (2023.01)
*H10N 69/00* (2023.01)

(52) U.S. Cl.
CPC ............. *H10N 60/12* (2023.02); *G06N 10/00* (2019.01); *H10N 69/00* (2023.02)

(58) Field of Classification Search
None
See application file for complete search history.

(56) References Cited

U.S. PATENT DOCUMENTS 9,836,699 B1\* 12/2017 Rigetti .................. H10N 69/00
2015/0155468 A1 6/2015 Abraham et al.
(Continued)

FOREIGN PATENT DOCUMENTS

CN 107564868 A 1/2018
JP 2016-511534 A 4/2016
(Continued)

OTHER PUBLICATIONS

International Search Report & Written Opinion for WO2020/035672 (PCT/GB2019/052271), dated Nov. 29, 2019, pp. 1-13.
(Continued)

*Primary Examiner* — Bradley Smith
(74) *Attorney, Agent, or Firm* — Thomas|Horstemeyer, LLP (57) ABSTRACT

A superconducting quantum computing circuit package (1). The package contains a substrate (2) on which a circuit is formed, the circuit including a plurality of circuit elements. The substrate (2) includes holes (8) arranged between the circuit elements which extend through a thickness of the substrate (2). The package also contains a holder (3) with a surface (9) on which the substrate (2) is received, and a cover (4) arranged on an opposite side of the substrate (2). The holder (3) and the cover (4) are formed from a metal and/or a superconductor. The holder (3) also contains projections (12) arranged on and projecting from the surface (9). The projections (12) protrude through the holes (8) in the substrate (2) and contact the cover (4) so to suppress electromagnetic modes in the frequency range of operation of the quantum computing circuit.

14 Claims, 6 Drawing Sheets

(56) References Cited

U.S. PATENT DOCUMENTS

2015/0372217 A1* 12/2015 Schoelkopf, III ..... H10N 60/01
505/413
2016/0204331 A1 7/2016 Abraham et al.
2016/0364653 A1* 12/2016 Chow .................... G06N 10/00

FOREIGN PATENT DOCUMENTS

| JP | 2018-011266 A | 1/2018 |
|----|---|---|
| RU | 177295 U1 | 2/2018 |
| RU | 2716028 C1 | 3/2020 |
| WO | 2017/021714 A1 | 2/2017 |
| WO | 2018/125026 A1 | 7/2018 |

OTHER PUBLICATIONS uK Search Report for GB1813188.8, dated Jan. 17, 2019, pp. 1-4.
Vahidpour et al., "Superconducting Through-Silicon Vias for Quantum Integrated Circuits", Rigetti Computing, 2017.
Rahamim et al., "Double-sided coaxial circuit QED with out-of-plane wiring", Applied Physics Letters 110, 222602, 2017.
McConkey et al., "Mitigating coherent leakage of superconducting qubits in a large-scale quantum socket", Institute for Quantum Computing, University of Waterloo, 2017.
Russian Office Action for Application No. 2021102443/28(005100), dated Dec. 21, 2022, pp. 1-7 (Translation Not Available).
Japanese Office Action for Application No. 2021-507577, dated Jul. 5, 2023, pp. 1-8 (Translation Included).
European Office Action for Application No. 19 758 454.3, dated Sep. 1, 2023, pp. 1-5.

* cited by examiner

SUPERCONDUCTING QUANTUM COMPUTING CIRCUIT PACKAGE

CROSS-REFERENCE TO RELATED APPLICATIONS

This application is the National Stage of International Application No. PCT/GB2019/052271, filed Aug. 13, 2019, which claims priority to GB 1813188.8, filed Aug. 13, 2018, which are entirely incorporated herein by reference.

This invention relates to a superconducting quantum computing circuit package, in particular to a superconducting quantum computing circuit package including a holder for a substrate of the superconducting quantum computing circuit.

In a quantum computing architecture it is desired to build circuit chips containing multiple qubits such that useful computation may be performed. However, scaling the chips increases the physical space occupied by the chip to a size that supports electromagnetic (EM) modes having frequencies comparable with the operating frequencies of the quantum computing circuit on the chip. For example, a rectangular chip enclosed in conducting material, and having side lengths greater than a few millimetres (and both greater than the thickness) and a high dielectric permittivity of around 10 can support EM modes in the range of several to several tens of gigahertz.

Such electromagnetic "chip-like" modes are almost always unwanted, particularly in the frequency range of several to several tens of gigahertz. These frequencies are similar to the desired operational frequencies of quantum computing circuits and thus they can interfere with the operation of a quantum computing circuit, through interactions with "circuit-like" modes, e.g. qubit modes, other circuit elements and control signals that are used. This can result in the loss of coherence in the circuit, which is important to maintain in order to prolong the operational lifetime of the circuit such that effective quantum processing can be performed.

As the size of a quantum computing circuit chip increases, frequency of the lowest frequency chip-like mode it can support decreases, thus causing the chip to host a greater number of unwanted modes within the operational frequency space of the circuits. Another problem experienced when scaling a quantum computing circuit chip and increasing the number of circuit elements in the circuit is that unwanted interactions between circuit-like modes (e.g. cross-talk interactions between qubits) may arise, which can interfere with the operation of the quantum computing circuit. This means that the issues of problematic interactions between chip-like and circuit-like modes, and between circuit-like and circuit-like modes, often only get worse as quantum computing circuits are scaled up, both in terms of the physical dimensions and the number of circuit elements. It is, for example, difficult to scale quantum computing circuits on high dielectric substrates to beyond about 1 cm by 1 cm in size without taking measures to remove spurious chip-like modes and/or their interactions with circuit-like modes.

One way to attempt to suppress spurious chip modes and cross-talk is to form vias which extend through the thickness of the substrate of a circuit. This introduces conductors among the circuit elements which act to disrupt and suppress the spurious chip modes by reducing the effective length scale over which standing waves may form in the chip, and also reduces cross-talk (e.g. between qubits) by providing conductors between the circuit elements, which can screen their field (e.g. capacitive and/or inductive) interactions.

However, the provision of vias in circuit chips introduces additional complexity to the fabrication of such chips and it may affect the operation of superconducting quantum computing circuits negatively. This is because such circuits are particularly sensitive to the presence of impurities and defects, which is not helped by the introduction of further steps in the manufacturing process.

The aim of the invention is to provide a device which provides a cleaner frequency space for the operation of quantum computing circuits.

When viewed from a first aspect the invention provides a superconducting quantum computing circuit package comprising:
 a substrate on which a superconducting quantum computing circuit is formed, wherein the superconducting quantum computing circuit comprises a plurality of circuit elements and the substrate comprises one or more holes arranged among the plurality of circuit elements, wherein the one or more holes extend through a thickness of the substrate; and
 a holder comprising a surface on which the substrate is received and a cover arranged on an opposite side of the substrate from the holder, wherein the holder and the cover are formed from a metal and/or a superconductor and the holder comprises one or more projections arranged on and projecting from the surface;
 wherein the one or more projections protrude through the one or more holes in the substrate and contact the cover so to suppress electromagnetic modes in the frequency range of operation of the quantum computing circuit.

The present invention provides a superconducting quantum computing circuit package. The package includes a substrate, a holder for the substrate and a cover on the opposite side of the substrate from the holder. The substrate has a superconducting quantum computing circuit formed on, e.g., its surface, with the circuit including multiple circuit elements such as qubits. One or more holes are formed to extend (all the way) through the substrate, with the holes being arranged among (e.g. two or more of) the circuit elements.

The substrate is located on a surface of the holder, which is formed from a metal and/or superconductor. The holder has one or more projections that are formed on and project from the surface on which the substrate is received. The one or more projections on the holder correspond to the one or more holes in the substrate such that the projection(s) protrude through the holes to contact the (inside surface of the) cover (when the cover is placed on the holder), such that the projections pass through the thickness of the substrate among the plurality of circuit elements. This current path between the holder and the cover, via the projection(s), acts to acts to break up the formation of standing waves in the chip (e.g. across the whole area of the chip), suppressing (e.g. substantially eliminating) within the chip those EM modes which are composed of such standing waves. This changes the field shape and frequencies of EM "chip-like" modes (e.g. confining any modes to between the edge of the substrate and the projection(s), or between projections when there are plural projections), thus helping to prevent electromagnetic modes being present in the package that are detrimental to the operation of the quantum computing circuit.

Thus it will be appreciated that the separate substrate and holder of the package allow conducting elements (i.e. the projections of the holder) to be provided among the circuit elements of the quantum computing circuit. The presence of the projections reduces the length scale over which standing waves may be set up, thus increasing the frequency of the lowest frequency EM modes. This helps to suppress (e.g. substantially eliminate) EM chip-like modes being set up having frequencies that are similar to the desired operational frequencies of the quantum computing circuit. This helps to reduce the interference between unwanted chip-like modes and the quantum computing circuit during operation.

The presence of the holes and projections among the circuit elements also helps to confine chip-like modes (e.g. modes that are substantially within a "chip", i.e. the substrate and the circuit formed thereon) and circuit-like modes (e.g. qubit modes, resonator modes, control lines modes, etc.) that are established to certain regions of the package and thus the quantum computing circuit, e.g. between the projections. This can help to improve the addressability (ability to be addressed independently) of the circuit elements and to reduce unwanted interactions (e.g. qubit crosstalk) in the quantum computing circuit during operation.

The separate holder, cover and substrate also help to minimise the number of fabrication steps required in the manufacture of the substrate and the quantum computing circuit. Preferably the substrate, holder and cover are formed as discrete components. For example, the holder and cover may be manufactured separately from the substrate (and from each other), such that the substrate may simply require holes to be formed through its thickness. This helps to minimise the number of defects and impurities in these parts.

The reduced interference, cross-talk and presence of impurities and defects in the quantum computing circuit all help to provide a clean electromagnetic environment for the quantum computing circuit to operate in, as well as enabling quantum computing circuits to be scaled onto larger chips with a larger number of, e.g., qubits without increasing the number of spurious EM mode interactions. This helps to prolong the coherence of the quantum computing circuit elements during operation, therefore improving the conditions for performing quantum computing calculations.

The Applicant has also appreciated that the arrangement of the present invention, with a separate holder, cover and substrate, provides a number of benefits over a substrate containing integrally formed vias. This is because vias are only able to remove chip like modes. Therefore if there are gaps between an enclosure surrounding the chip and the chip, spurious modes can exist in these gaps that could still interfere with the quantum computing circuit, which are not removed by vias. With the projections of the holder of the present invention passing through the holes in the substrate and contacting the cover, the projections pass through any gap regions in the vicinity of the qubits, protecting them from spurious gap modes as well.

The substrate may be any suitable and desired substrate for forming a superconducting quantum computing circuit on the substrate, e.g. for use in a superconducting environment. Preferably the substrate comprises a high dielectric substrate. The substrate may be formed from any suitable and desired material, e.g. silicon or sapphire.

The substrate may be any suitable and desired shape. In one embodiment the substrate is substantially planar (other than the holes extending through the thickness of the substrate).

The plurality of circuit elements of the quantum computing circuit may comprise any suitable and desired circuit elements. In one embodiment the plurality of circuit elements comprises one or more (e.g. all) of: a qubit (e.g. comprising a Josephson junction and superconducting electrodes), a control line and a readout element (e.g. resonator). Preferably the plurality of circuit elements comprises a plurality of sets of a qubit, a control line and a readout element. The circuit elements may be arranged in any suitable and desired way, e.g. as outlined in the Applicant's previous application published as WO 2017/021714 A1 in which the superconducting electrodes of the qubit are coaxial and coplanar, and the control line and/or the readout element are arranged out of plane with respect to the qubit. It will be appreciated that the arrangement of the quantum computing circuit package of the present invention (in at least preferred embodiments) is suited to including such a layout of a quantum computing circuit.

In a preferred embodiment the plurality of circuit elements comprises a plurality of qubits and, e.g., control lines and readout elements. The qubits may be any suitable and desired size, and may be spaced from each other by any suitable and desired distance. In one embodiment the qubits have a maximum dimension of between 0.1 mm and 1 mm. In one embodiment the plurality of qubits are spaced from adjacent qubits by between 0.2 mm and 2 mm.

The circuit elements of the quantum computing circuit are preferably formed on a surface of the substrate. Preferably the thickness of the substrate is significantly smaller than its other two dimensions (e.g. length and width), e.g. in directions perpendicular to the thickness of the substrate. Thus preferably the substrate has two faces on opposite sides of the substrate (separated by the thickness of the substrate) on which circuit elements may be formed. Preferably one of these faces is directed towards the surface of the holder when the substrate is placed onto the holder.

In one embodiment the circuit elements are formed only on one face of the substrate, e.g. the face opposite the surface of the holder. In another embodiment the circuit elements are formed on both faces of the substrate. It will be appreciated that the design of the package allows for this owing to the separation of the conducting elements (i.e. the projections of the holder) from the substrate. In contrast, a substrate containing vias (which are provided integrally in the substrate) may allow for circuit elements to be provided on both sides of a substrate; however, this would require a complicated multistage fabrication process. The package design of the present invention thus remains compatible with a wide range of circuit designs.

In one embodiment the substrate is not fixedly attached (e.g. glued or bonded) to the holder or the cover in the package. Instead, for example, the (e.g. face of the) substrate may simply rest on the surface of the holder and/or the cover. This again helps to allow, in some embodiments, the circuit elements of the quantum computing circuit to be formed on the face of the substrate that faces the surface of the holder (and thus, for example, on both faces of the substrate).

The holder and the cover may be formed from any suitable and desired metal and/or superconductor, e.g. a superconducting metal. In one embodiment the metal comprises aluminium.

The holder may be any suitable and desired shape for receiving the substrate. In one embodiment the surface for receiving the substrate is substantially planar (other than the projections). In one embodiment the holder is substantially cuboid.

In one embodiment the surface for receiving the substrate is recessed from a face of the holder, e.g. from a face of the cuboid. In other words, the holder may comprise a rim around (and projecting above) the surface for receiving the substrate.

The surface may be recessed by any suitable and desired depth. In one embodiment the surface is recessed from the face of the holder by a depth substantially equal to the thickness of the substrate, e.g. the rim has a height substantially equal to the thickness of the substrate. Thus preferably when the substrate is received by the surface, the (e.g. outer surface of the) substrate lies substantially flush with the face of the holder (and, e.g., the rim).

In one embodiment the projections arranged on the surface project in a direction substantially perpendicular to the (e.g. planar) surface. Thus preferably the holes in the substrate extend in a direction substantially perpendicular to the surface (e.g. face) of the substrate.

The one or more projections on the surface of the holder may be any suitable and desired shape, dimensions and spacing from each other. Preferably there are a plurality of projections arranged on and projecting from the surface. The projections may be arranged relative (e.g. in position and/or number) to the circuit elements (e.g. qubits) in any suitable and desired way. In one embodiment the holder comprises at least as many projections as the number of qubits in the quantum computing circuit on the substrate. In one embodiment the projections are arranged such that there are a plurality of circuit elements (e.g. qubits) between each projection. Thus, for example, there may be at least as many circuit elements (e.g. qubits) as projections.

Preferably the hole(s) in the substrate correspond in shape and (slightly larger) size to the projection(s) of the holder, so that the hole(s) receive the projection(s) when the substrate is placed on the holder. Preferably there are a plurality of holes in the substrate. As with the projections, similarly the substrate may comprise at least as many holes as the number of qubits in the quantum computing circuit on the substrate. In one embodiment the holes are arranged such that there are a plurality of circuit elements (e.g. qubits) between each hole. Thus, for example, there may be at least as many circuit elements (e.g. qubits) as holes. Preferably the substrate comprises an equal number of holes to the number of projections on the surface of the holder.

The one or more holes (and thus the corresponding one or more projections) may be arranged among the plurality of circuit elements in any suitable and desired way, e.g. in a configuration that acts to suppress chip-like modes in the frequency range of operation of the quantum computing circuit. Preferably the one or more holes are arranged between the plurality of circuit elements, wherein the one or more projections protrude through at least part of the thickness of the substrate between the plurality of circuit elements.

Preferably the one or more holes (and thus the one or more projections) are arranged among (e.g. between (e.g. to intersperse)) the qubits of the quantum computing circuit formed on the substrate. Preferably the one or more projections (and thus the one or more holes) are arranged to pass between the (e.g. adjacent) qubits. This helps to reduce unwanted interactions between circuit-like modes (e.g. to reduce the cross-talk between adjacent qubits) in addition to the suppression of the spurious electromagnetic modes. In one embodiment the projections are arranged in a (e.g. regular geometric) grid, e.g. corresponding to a (e.g. regular geometric) grid of qubits in the quantum computing circuit.

It will be appreciated that the holes and the corresponding projections may be arranged in any suitable and desired configuration such that they suppress the chip-like and, e.g., circuit-like modes in the operational frequency range of the quantum computing circuit, e.g. to confine the modes to the vicinity of individual qubits (such that the modes do not extend over plural qubits). In a preferred embodiment the maximum spacing between adjacent holes and/or projections corresponds to (e.g. would be able to support) a chip-like mode having a frequency (e.g. significantly) greater than the maximum operational frequency of the quantum computing circuit.

Preferably the arrangement (e.g. size and spacing) of the projections and the corresponding holes is related to (e.g. matches) the arrangement (e.g. size and spacing) of the circuit elements (e.g. qubits) of the quantum computing circuit on the substrate. In one embodiment, when the holder comprises a plurality of projections, the plurality of projections are spaced from adjacent projections by between 0.2 mm and 2 mm (and similarly for the holes to accommodate the corresponding projections).

Preferably the one or more projections are (e.g. each) between 0.2 mm and 1 mm (e.g. approximately 0.5 mm) in height (i.e. in the direction in which they project from the surface of the holder).

In order to contact the cover, the one or more projections may extend part way through the thickness of the substrate and the cover may comprise corresponding projections (projecting from a surface of the cover) that also extend part way through the thickness of the substrate (from the other side of the substrate), such that the one or more projections of the holder contact the corresponding one or more projections of the cover. When the cover comprises one or more projections, preferably the optional and preferable features outlined herein with respect to the one or more projections of the holder may also apply to the one or more projections of the cover.

As discussed above, it will be appreciated that the height of the projection(s) may depend on how far the projection(s) project through the substrate. Thus, in one embodiment, the one or more projections (e.g. each) have a height that is greater than or equal to half the thickness of the substrate, e.g. substantially equal to the thickness of the substrate.

However, preferably the one or more projections (of the holder) extend all the way through the thickness of the substrate to contact the cover. Thus preferably the height of the one or more projections is (e.g. each) greater than or equal to the thickness of the substrate. The Applicant has found that when the projections extend all the way through the thickness of the substrate, this may be particularly effective in suppressing (e.g. substantially eliminating) electromagnetic modes in the operational frequency range of the quantum computing circuit.

When the holder comprises a recess or rim, preferably the depth of the recess or height of the rim is substantially equal to the height of the one or more projections. Thus preferably the depth of the recess or height of the rim is between 0.2 mm and 1 mm (e.g. approximately 0.5 mm).

Preferably the one or more projections are (e.g. each) between 0.2 mm and 1 mm (e.g. approximately 0.5 mm) in width (i.e. in the direction parallel to the surface of the holder). Thus preferably the one or more holes are (e.g. each) between 0.2 mm and 1 mm (e.g. approximately 0.5 mm) in width (i.e. in the direction parallel to the face of the substrate).

Preferably the one or more projections and the (corresponding) one or more holes are (e.g. each) substantially cylindrical. Thus, for example, the one or more projections (e.g. each) have a cross-section (in a plane substantially parallel to the surface of the holder) that is substantially constant in the direction in which the one or more projections project, e.g. in a direction substantially perpendicular to the surface of the holder. Correspondingly, for example, the one or more holes (e.g. each) have a cross-section (in a plane substantially parallel to the face of the substrate, i.e. substantially perpendicular to the thickness of the substrate) that is substantially constant in the direction in which the holes extend through the substrate, e.g. in a direction substantially perpendicular to the face of the substrate (i.e. substantially parallel to the thickness of the substrate).

Thus the one or more projections may (e.g. each) take the form of a wall or a pillar and the (corresponding) one or more holes may (e.g. each) take the form of a channel or a pillar-shaped hole. In one embodiment the one or more projections and the one or more holes (e.g. each) have a circular cross-section (and thus the axis of the cylinder of a projection or a hole) that is arranged in a direction substantially perpendicular to the surface of the holder or to the face of the substrate (i.e. substantially parallel to the thickness of the substrate).

In a preferred embodiment the distal end of (e.g. each of) the one or more projections is tapered, e.g. rounded or pointed. This helps to ensure that the distal end(s) of the one or more projections contact the cover. The Applicant has appreciated, at least in some embodiments of the present invention, that small gaps between the projection(s) and the cover may cause problems in not suppressing the modes. For example, a gap as small as 1 µm may cause a problem.

The one or more projections (and corresponding holes) may be arranged (e.g. shaped, sized and/or positioned) to suppress (e.g. substantially eliminate) any suitable and desired electromagnetic (e.g. chip-like) modes in the frequency range of operation of the quantum computing circuit. In one embodiment the one or more projections are arranged to suppress (e.g. substantially eliminate) all electromagnetic (e.g. chip-like) modes in the frequency range of operation of the quantum computing circuit.

However, in some embodiments the one or more projections may be arranged (e.g. positioned) to suppress some (but not all) electromagnetic (e.g. chip-like) modes in the frequency range of operation of the quantum computing circuit. For example, the one or more projections may be arranged (e.g. positioned) to engineer and use chip-like modes. This may be used, for example, to mediate long-range interactions between qubits, which could be used to create quantum circuits with particular connectivities.

For example, when the package comprises a plurality of projections, some of the projections (and the corresponding holes in the substrate) may be arranged closer together (e.g. to suppress modes and confine them to not penetrating beyond individual qubits) while others of the projections may be arranged further apart from each other (or, e.g., spaced from the edge of the substrate) to allow modes to exist and extend between qubits. The spacing of the projections and the corresponding holes may therefore be chosen accordingly.

The operational frequency range of the quantum computing circuit may be any suitable and desired range of frequencies that is suitable for performing computations in a quantum computing circuit. In one embodiment the operational frequency range is between 4 GHz and 12 GHz. While the projection(s) that protrude into the hole(s) of the substrate may suppress electromagnetic modes only the in the operational frequency range of the quantum computing circuit, preferably the projection(s) that protrude into the hole(s) of the substrate are arranged to suppress electromagnetic modes over a greater frequency range.

In one embodiment the projection(s) that protrude into the hole(s) of the substrate are arranged to suppress electromagnetic modes having a frequency of less than 12 GHz, e.g. less than 15 GHz, e.g. less than 20 GHz.

In one embodiment the holder comprises one or more apertures formed through the surface of the holder, wherein the quantum computing circuit package comprises one or more wires arranged to pass through the one or more apertures respectively to connect to the (e.g. plurality of circuit elements of the) quantum computing circuit. Providing aperture(s) in the holder helps to route control wiring for the quantum computing circuit, e.g. to address the qubits.

It will be appreciated that when the circuit elements are arranged with the control line and/or the readout element out of plane with respect to the qubit, e.g. as outlined in the Applicant's previous application published as WO 2017/021714 A1, providing apertures in the holder for the control line and/or the readout element (and, e.g., their connecting wires) to pass through, helps to provide a compact and neatly arranged package. Thus embodiments of the present invention lend themselves well to accommodating off-chip control wiring (and quantum computing circuits including such wiring). Such configurations may be considered more scalable than those that implement on-chip control wiring.

The one or more apertures in the holder are preferably arranged between (e.g. to intersperse) the one or more projections, e.g. so that they correspond to the circuit elements (e.g. qubits) of the quantum computing circuit formed on the substrate. This helps to connect up the circuit elements of the quantum computing circuit to off-chip control wiring.

The cover is positioned opposite the substrate from the holder, e.g. the substrate is sandwiched between the holder and the cover. The cover helps to shield the circuit elements from external electromagnetic radiation and to further reduce the spurious electromagnetic modes able to be established. In one embodiment the cover is arranged with the holder to enclose the substrate, e.g. when the holder comprises a rim.

The cover may be any suitable and desired size. Preferably the cover extends at least beyond the perimeter of the substrate (e.g. the surface of the cover that faces the substrate has dimensions that are greater than or equal to the corresponding dimension of the face of the substrate that faces the cover).

In one embodiment the cover comprises one or more apertures formed through the cover, wherein the quantum computing circuit package comprises one or more wires arranged to pass through the one or more apertures respectively to connect to the (e.g. plurality of circuit elements of the) quantum computing circuit. As with the apertures through the holder, the apertures through the cover also help to provide routes for connecting wires to the quantum computing circuit, e.g. when the quantum computing circuit has off-chip control wiring, and particularly when the circuit elements of the quantum computing circuit are formed on both faces of the substrate. In this latter case, when apertures are provided through both the holder and the cover, this allows circuit elements on both faces of the substrate to be accessed and connected to easily.

The (e.g. surface of the) cover is preferably configured to be spaced from the circuit elements on the (e.g. face of the) substrate, so the cover does not contact the circuit elements formed on the substrate (e.g. when at least some of the circuit elements are arranged on the face of the substrate facing the cover). This helps to avoid short-circuiting the circuit elements of the quantum computing circuit (e.g. against the surface of the cover facing the substrate).

The cover may be any suitable and desired shape. In one embodiment the cover is substantially planar. In one embodiment the cover is substantially cuboid. Preferably the shape of the cover is complementary to the shape of the holder (and, e.g., the substrate), e.g. to enclose the substrate.

In one embodiment the cover comprises cut-outs in its surface corresponding to, and facing, the circuit elements on the substrate (e.g. the circuit elements arranged on the face of the substrate facing the cover) so to space the cover from the circuit elements on the substrate.

In one embodiment the cover is spaced from the (e.g. entire) face of the) substrate so to space the cover from the circuit elements on the substrate.

The cover may be spaced from the substrate in any suitable and desired way. For example, the recess in the holder may have a depth that is greater than the thickness of the substrate, so that the face of the substrate facing the cover is spaced from the cover. In another example, the cover may comprise a recess such that the cover is spaced from the substrate. In another example, the projection(s) on the holder may have a height that is greater than the thickness of the substrate, such that the projection(s) project through and beyond the thickness of the substrate, so to space the cover (which, e.g., is arranged to abut against the projection(s)) from the substrate.

When the substrate comprises circuit elements on the face of the substrate facing the holder, preferably the (e.g. surface of the) holder is configured to be spaced from the circuit elements on the (e.g. face of the) substrate, e.g. in a similar manner to the cover. Thus, for example, the holder may comprise cut-outs in its surface corresponding to, and facing, the circuit elements on the substrate (e.g. the circuit elements arranged on the face of the substrate facing the holder) so to space the holder from the circuit elements on the substrate.

The one or more projections may contact the cover in any suitable and desired way. Preferably (e.g. each of) the one or more projections are arranged to form an electrically conducting contact with the cover.

In one embodiment the cover comprises one or more depressions (on the surface of the cover facing the substrate) corresponding to (e.g. the shape, size and/or position of) the one or more projections (and to the one or more holes through the substrate), wherein the depression(s) are arranged to receive the (e.g. tapering distal end(s)) of the one or more projections, such that the one or more projections contact the cover in the corresponding one or more depressions. The depression(s) help to locate the corresponding one or more projections and to help a good contact to be made between the projection(s) and the cover.

Preferably the cover comprises a volume of a conducting material in (e.g. each of) the one or more depressions, wherein the material is softer (e.g. more malleable and/or ductile) than the metal of the cover. The conducting material in the depression(s) helps to form a good (e.g. electrically conducting) contact between the projection(s) and the cover (i.e. the one or more projections are (e.g. each) arranged to contact the conducting material in the respective one or more depressions). Preferably the conducting material deforms when it is contacted by the one or more projections. It will be appreciated that this deformation helps to counteract any manufacturing tolerances of the cover and the projection(s) and avoids having to match the shape and/or size of the (e.g. depression(s) of the) cover to the shape and/or size of the projection(s). Preferably the conducting material comprises a metal, e.g. indium.

In one embodiment the holder and the cover comprise (i.e. have been subject to) a surface treatment. This helps to provide a (e.g. ultra) clean surface, helping to avoid impurities or defects in the quantum computing circuit package. The surface treatment may be provided in any suitable and desired way, e.g. by etching.

The holder, substrate and cover may be manufactured in any suitable and desired way. In one embodiment one or more of the holder, the substrate and the cover may be manufactured using laser machining, computer numerical control (CNC) machining or mechanical micromachining. The holes in the substrate may be formed before or after the circuit elements are fabricated on the substrate.

Preferably the quantum computing circuit package, and the holder and cover in particular, are arranged to be cooled by a (e.g. cryogenic) cooling system, e.g. when the holder is formed from a superconductor. Thus the invention extends to a superconducting quantum computing system comprising a superconducting quantum computing circuit package according to an embodiment of the present invention, and a (e.g. cryogenic) cooling system arranged to cool the holder and the cover (e.g. to superconducting temperatures). Thus preferably the holder and the cover, which are formed from a metal or a superconductor, is cooled by the cooling system to cool the substrate (e.g. to superconducting temperatures).

It will be appreciated that, at least in preferred embodiments, the design of the holder and the cover helps to maximise the surface contact area with the substrate (on which the circuit elements are provided), which helps to enhance the thermal connectivity of the substrate to the cooling system (and thus helps to maximise the heat conduction rate from the substrate), in order to cool the substrate (e.g. to superconducting temperatures).

Any suitable and desired (e.g. cryogenic) cooling system may be used, e.g. a dilution refrigerator.

A preferred embodiment of the invention will now be described, by way of example only, with reference to the accompanying drawings in which.

Scaling quantum computing chips to include multiple qubits increases the physical space occupied by the chip to a size that supports electromagnetic modes having frequencies comparable with the operating frequencies of the quantum computing circuit on the chip. Such spurious EM chip-like modes may interfere with the operation of a quantum computing circuit resulting in a detrimental lack of coherence in the qubits. As will now be described, an embodiment of the present invention provides a superconducting quantum computing circuit package in which these spurious modes, as well as cross-talk, are suppressed.

Figure 1:
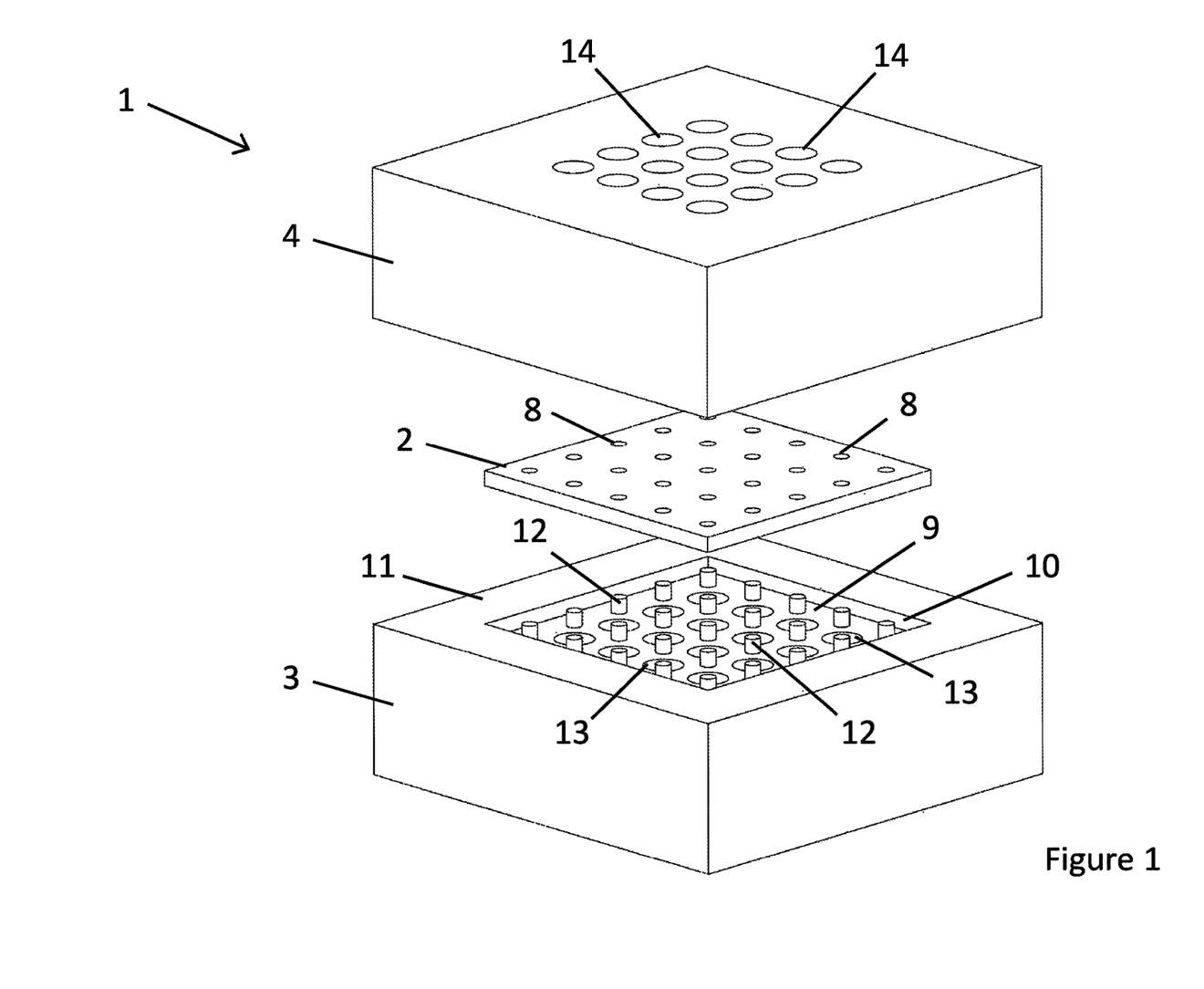
FIG. 1 shows a superconducting quantum computing circuit package according to an embodiment of the present invention.

FIG. 1 shows a superconducting quantum computing circuit package 1 according to an embodiment of the present invention. The package 1 includes a substrate 2, a holder 3 for the substrate 2 and a cover 4. The package 1 is shown in FIG. 1 in an expanded configuration, e.g. prior to assembly.

Figure 2:
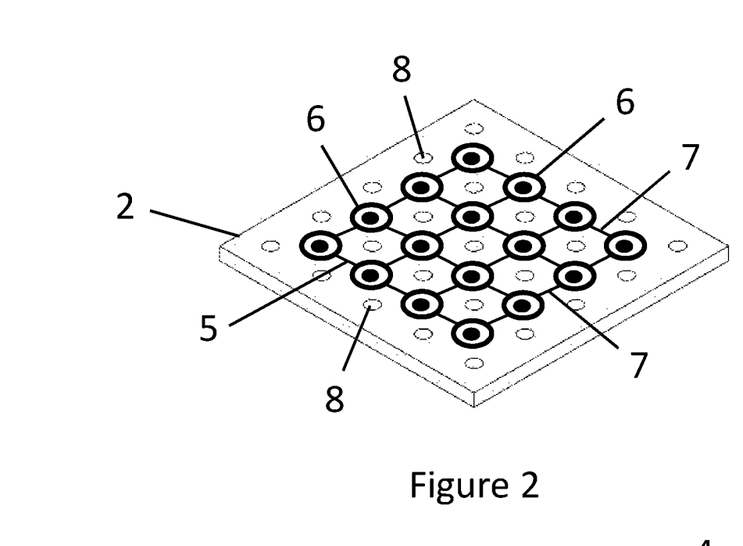
FIG. 2 shows the substrate of the superconducting quantum computing circuit package shown in FIG. 1.

FIG. 2 shows the substrate 2 of the superconducting quantum computing circuit package 1 shown in FIG. 1. The substrate is typically made from silicon or sapphire. A quantum computing circuit 5 is formed on the surface of the substrate 2 (a similar circuit may also be formed on the opposite face of the substrate 2).

The quantum computing circuit 5 includes multiple qubits 6 arranged in a regular geometric grid. The qubits 6 are connected together by respective interconnections 7. The qubits 6 are addressed by respective control lines and readout elements, e.g. as disclosed in the Applicant's previous application published as WO 2017/021714 A1.

Multiple holes 8 are formed (e.g. machined) through the thickness of the substrate 2. The holes 8 are arranged in a regular geometric grid to intersperse the qubits 6. (Similarly, on the reverse of the substrate 2, the qubits and their interconnections will be formed between the holes 8.)

Returning to FIG. 1, the holder 3 of the superconducting quantum computing circuit package 1, which is made of aluminium (or another suitable superconducting metal), is substantially cuboid shaped. The upper surface 9 of the holder 3 has a recess 10 formed in the surface 9 such that a rim 11 extends around the perimeter of the upper surface 9. The depth of the recess 10 is substantially equal to the thickness of the substrate 2, so that when the substrate 2 is placed onto the upper surface 9 of the holder 3, the upper face of the substrate 2 lies flush with the rim 11 of the holder 3.

Multiple cylindrical projections 12 are formed on the upper surface 9 of the holder 3 in the recess 10. The projections 12 correspond in position and number to the holes 8 formed through the substrate 2. The projections 12 have a cylindrical diameter slightly smaller than the corresponding diameter of the holes 8 in the substrate 2, and a height that is slightly greater than the thickness of the substrate 2, such that when the substrate 2 is placed onto the upper surface 9 of the holder 3 and the cover 4 is placed on top of the holder 3 to enclose the substrate 2, the projections 12 pass through the corresponding holes 8 and the top of the projections 12 contact the inner surface of the cover 4.

Multiple apertures 13 are formed through the holder 3 within the recess 10. Similarly, multiple apertures 14 are formed through the cover 4. The apertures 13, 14 through the holder 3 and the cover 4 correspond in number and position to the qubits 6 formed on the substrate 2. The apertures 13, 14 allow off-chip control wiring to be routed through the holder 3 and the cover 4 to connect to the qubits 6 of the quantum computing circuit 5.

Figure 3:
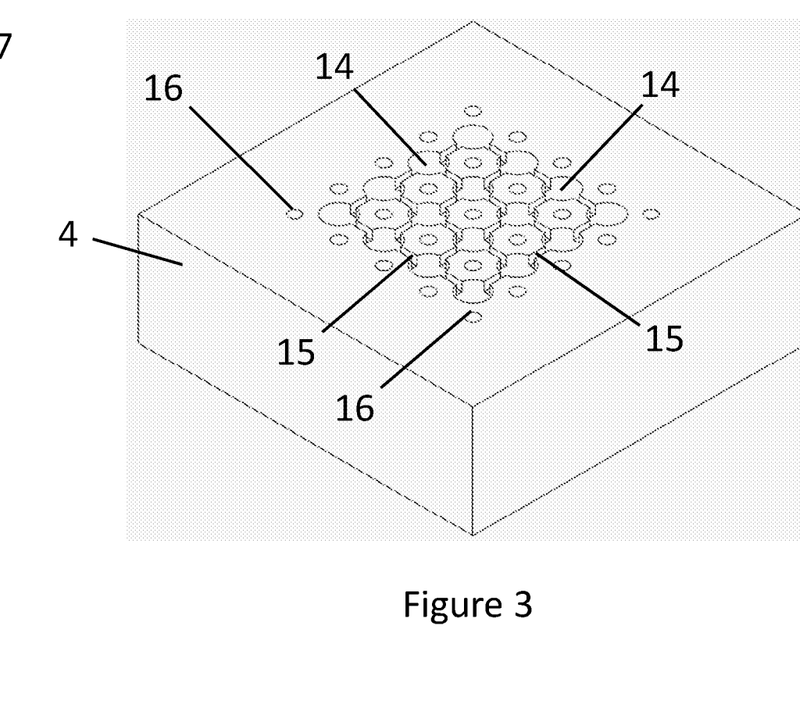
FIG. 3 shows the cover of the superconducting quantum computing circuit package shown in FIG. 1.

FIG. 3 shows the underside of the cover 4. The apertures 14 through the cover 4 can be seen, as can cut-out channels 15 that extend between the apertures 14. The cut-out channels 15 correspond in position and number to the interconnections 7 between the qubits 6 of the quantum computing circuit 5. The width of the cut-out channels 15 is wider than the width of the interconnections 7, such that when the cover 4 is placed on top of the substrate 2, the cover 4 does not come into contact with (and therefore does not short-circuit) the circuit elements of the quantum computing circuit 5. (When a quantum computing circuit is formed on the opposite face of the substrate 2, similar cut-out channels may be provided between the apertures 13 formed through the holder 3.)

The underside of the cover 4 shown in FIG. 3 also shows multiple depressions 16 formed in the underside of the cover 4. The depressions 16 correspond in position and number to the holes 8 formed through the substrate 2, and thus also to the projections 12 of the holder 3.

Figure 4:
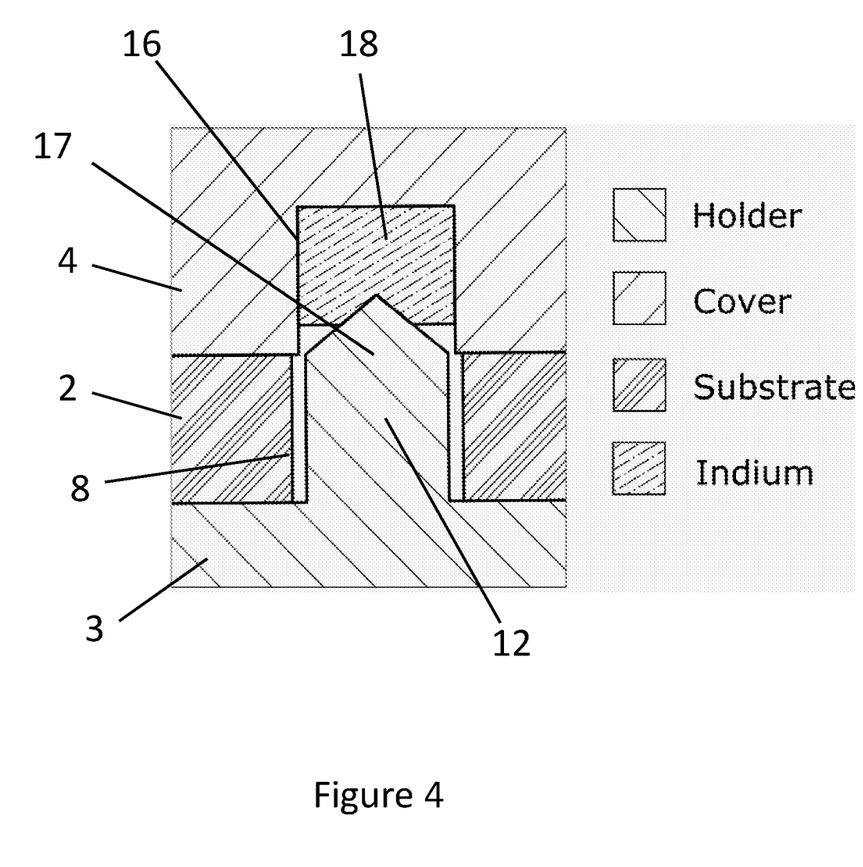
FIG. 4 shows a cross-section of part of a superconducting quantum computing circuit package according to an embodiment of the present invention.

FIG. 4 shows the cross-section of part of the superconducting quantum computing circuit package 1. FIG. 4 shows the holder 3, cover 4 and the substrate 2 around a depression 16 in the cover 4, a hole 8 in the substrate 2 and a projection 12 of the holder 3. The projection 12 has a tapered distal end 17 which passes through the hole 8 in the substrate 2 and is aligned with the depression 16 in the cover 4. The depression 16 (and all the other depressions 16 in the cover 4) has a cylindrical diameter slightly larger than the corresponding diameter of the projection 12, such that the projection 12 is received by the depression 16.

The depression 16 (and all the other depressions 16 in the cover 4) is nearly filled with a volume of indium 18. The indium 18 is a soft metal that deforms when the substrate 2 is sandwiched between the cover 4 and the holder 3, such that the tapered distal end 17 of the projection 12 protrudes into the volume of indium 18. This helps to make a good conducting connection between the holder 3 and the cover 4.

The components of the superconducting quantum computing circuit package 1 are manufactured using laser machining, computer numerical control (CNC) machining or mechanical micromachining.

Figure 5:
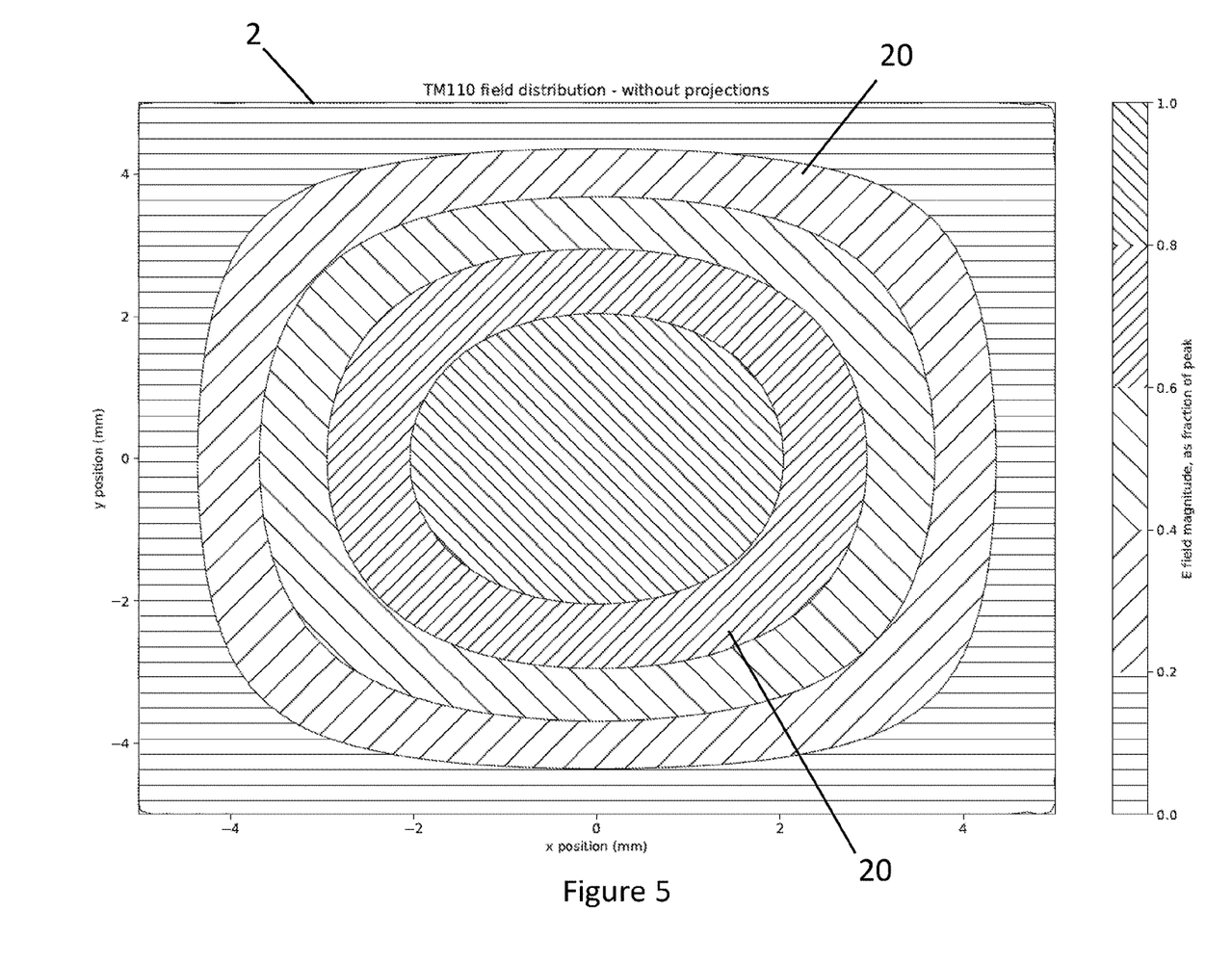
FIGS. 5 and 6 show plots of the lowest frequency electromagnetic mode generated by superconducting quantum computing circuits.
Figure 6:
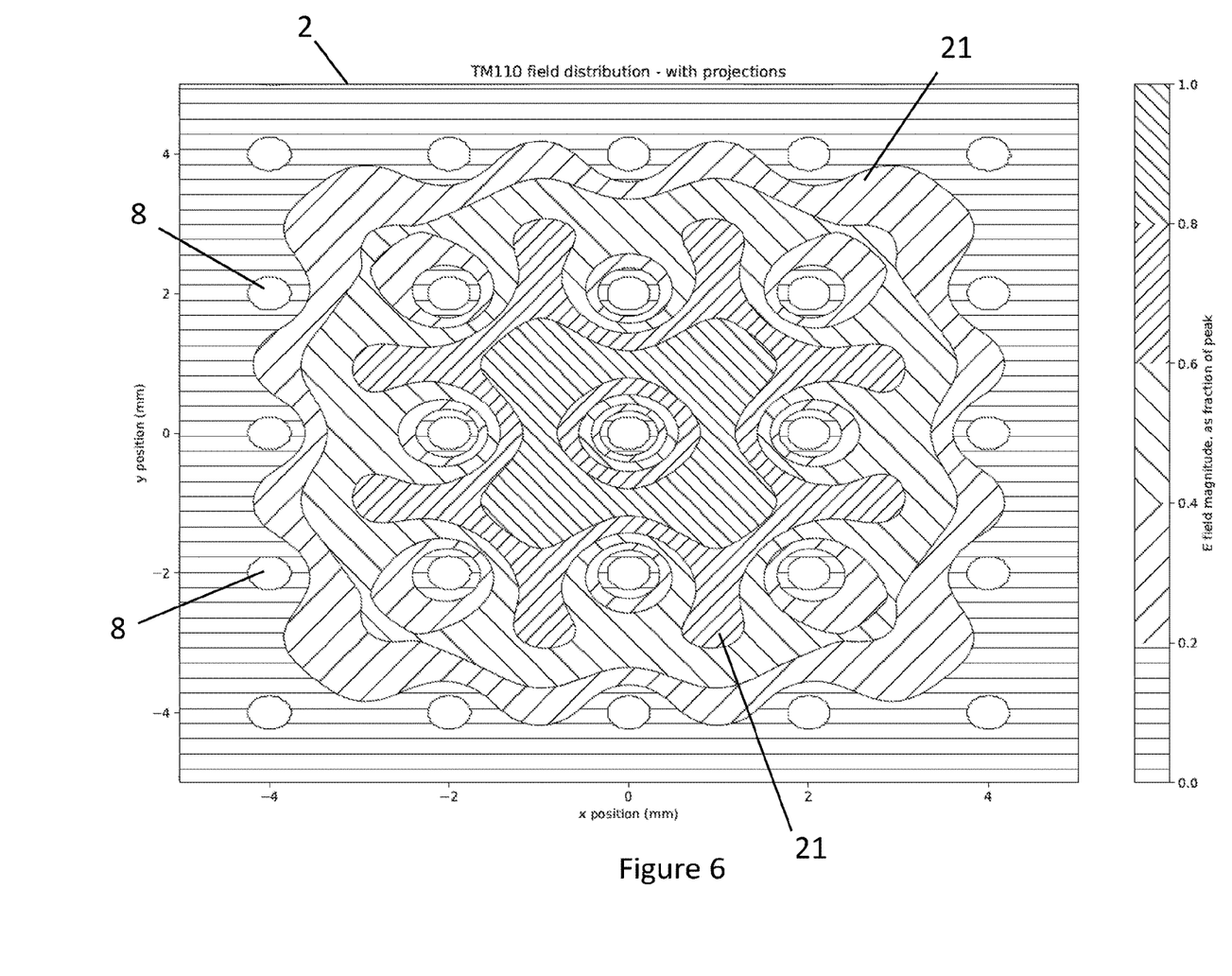
Figure 7:
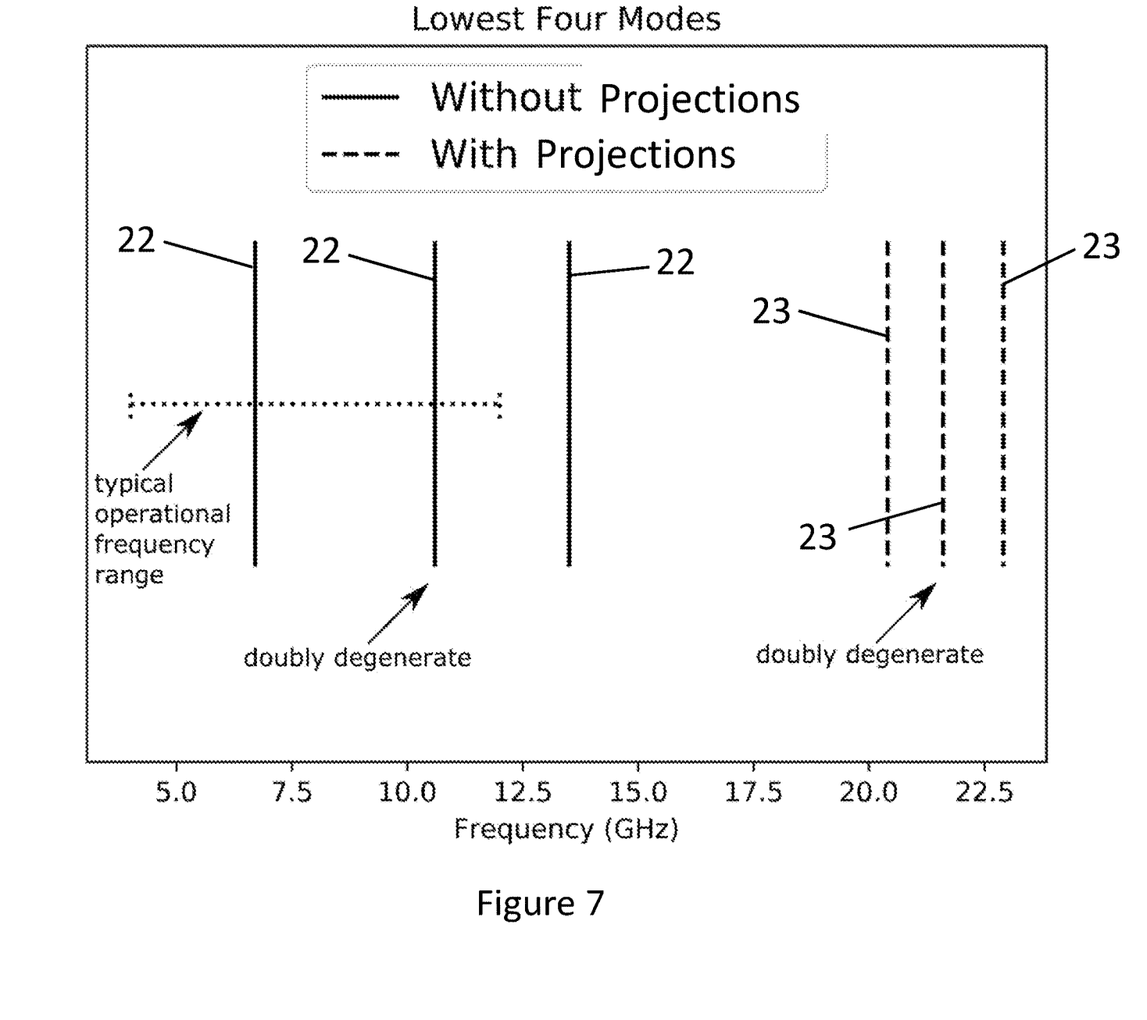
FIG. 7 shows a plot of the frequency spectra of electromagnetic modes generated for different superconducting quantum computing circuit packages.

Use of the superconducting quantum computing circuit package 1 will now be described with reference to FIGS. 1, 2, 3 and 4, as well as to FIGS. 5, 6 and 7. FIG. 5 shows a plot of the distribution of the electric field magnitude of the lowest frequency chip-like mode in a 1 cm×1 cm sapphire substrate 2 that has no holes through it (and thus no projections passing through the substrate 2). FIG. 6 shows a plot of the distribution of the electric field magnitude of the lowest frequency chip-like mode generated by a superconducting quantum computing circuit on a 1 cm×1 cm sapphire substrate 2 that is enclosed by the holder 3 and cover 4 shown in FIGS. 1-4. FIG. 7 shows a plot of the frequency spectra of electromagnetic modes generated for different superconducting quantum computing circuit packages.

Once the quantum computing circuit 5 has been formed on the substrate 2, the elements of the quantum computing circuit 5 are connected to off-chip wiring that is used to control the computations performed by the quantum computing circuit 5. The substrate 2 is inserted into the recess 10 in the holder 3 so that it sits on the upper surface 9 of the holder 3 with the projections 12 passing through the thickness of the substrate. The cover 4 is placed over the top of, and thus enclosing, the substrate 2, such that the projections 12 contact the underside of the cover 4 via the volumes of indium 18 in the depressions 16 in the underside of the cover 4. The off-chip control wiring is passed through the apertures 13, 14 in the holder 3 and the cover 4 and suitably connected to control circuitry.

The superconducting quantum computing circuit package 1 is placed into a suitable cryogenic system, to enable its operation at a superconducting temperature.

During operation of the quantum computing circuit 5, electromagnetic modes are established over the substrate 2. Were the quantum computing circuit 5 to be formed on a substrate 2 not having holes therethrough (and thus projections not passing therethrough), the distribution of the lowest frequency electromagnetic mode 20 generated (in one particular mode of operation) is that shown in the plot of FIG. 5. This distribution of the lowest frequency mode 20 shows that the mode 20 generated extends over the whole of the substrate 2 and thus passes between the qubits 6 of the quantum computing circuit 5. This mode is at around 7 GHz and so is likely to result in interference with, and cross-talk between, the qubits 6.

The frequency spectra of the four lowest frequency electromagnetic modes generated during operation of the quantum computing circuit in this configuration (i.e. without holes and projections passing through the substrate 2) is shown in FIG. 7. This shows that the four lowest frequency chip-modes 22 generated are in the range between 6 GHz and 14 GHz. Thus these frequencies of the spurious electromagnetic modes 20, 22 overlap with the microwave frequencies used for operating the quantum computing circuit 5, which are in the range 4 GHz to 12 GHz (as shown in FIG. 7). The spurious electromagnetic modes 20, 22 at these frequencies and the cross-talk between the qubits 6, owing to the distribution of these spurious modes 20, 22, interferes with the operation of the quantum computing circuit 5 resulting in a detrimental lack of coherence in the qubits 6.

FIG. 6 shows a plot of the distribution of the lowest frequency electromagnetic mode 21 generated when the substrate 2 is placed within the holder 3 and the cover 4 shown in FIGS. 1-4. Owing to the projections 12 of the holder 3, which pass through the thickness of the substrate 2 and thus are positioned between the circuit elements (including the qubits 6) of the quantum computing circuit 5 when the substrate 2 is placed onto the surface 9 of the holder 3, it can be seen from FIG. 6 that a lowest electromagnetic mode 21 is still generated during operation of the quantum computing circuit 5, but it is confined to the volumes between each set of adjacent projections 12. This mode is at around 20 GHz, and so is unlikely to interfere with the qubits 6 or cause cross-talk between them, owing to the large detuning from their operational frequencies. Additionally, the projections will act to localise circuit modes into the nearest volumes between each set of adjacent projections 12, further helping to reduce cross-talk between the qubits 6.

Furthermore, as shown in FIG. 7, which shows the frequency spectra of the four lowest frequency electromagnetic modes 23 generated during operation of the quantum computing circuit in this configuration (i.e. with holes and projections passing through the substrate 2 as shown in FIGS. 1-4), the minimum frequency of the spurious electromagnetic modes 21, 23 is increased to above the microwave frequencies used for operating the quantum computing circuit 5, owing to the modes being confined to these smaller volumes (as shown in FIG. 6).

Thus FIG. 7 shows the effect on the suppression of electromagnetic modes in the operational frequency range of the quantum computing circuit, owing to the uplift in the frequency of lowest frequency spurious mode, when using a superconducting quantum computing circuit package according to an embodiment of the present invention.

For these reasons, when operating the quantum computing circuit 5 using the superconducting quantum computing circuit package 1 shown in FIGS. 1-4, spurious electromagnetic modes and cross-talk are highly suppressed. This helps to allow a much cleaner frequency space for the operation of the quantum computing circuit 5, thus helping to increase the coherence time of the qubits 6.

The invention claimed is:

1. A superconducting quantum computing circuit package comprising:
a substrate on which a superconducting quantum computing circuit is formed, wherein the superconducting quantum computing circuit comprises a plurality of circuit elements and the substrate comprises one or more holes arranged between the plurality of circuit elements, wherein the one or more holes extend through a thickness of the substrate; and
a holder comprising a surface on which the substrate is received and a cover arranged on an opposite side of the substrate from the holder, wherein the holder and the cover are formed from a metal and/or a superconductor and the holder comprises one or more projections arranged on and projecting from the surface;
wherein the one or more projections protrude through the one or more holes in the substrate and contact the cover so to suppress electromagnetic modes in the frequency range of operation of the quantum computing circuit; and
wherein the holder comprises one or more apertures formed through the surface of the holder, wherein the superconducting quantum computing circuit package comprises one or more wires arranged to pass through the one or more apertures respectively to connect to the quantum computing circuit.

2. The superconducting quantum computing circuit package as claimed in claim 1, wherein the plurality of circuit elements comprises one or more of: one or more qubits, one or more control lines and one or more readout elements.

3. The superconducting quantum computing circuit package as claimed in claim 2, wherein the maximum spacing between adjacent holes in the substrate and/or between adjacent projections on the holder corresponds to a chip-like mode having a frequency greater than the maximum operational frequency of the quantum computing circuit.

4. The superconducting quantum computing circuit package as claimed in claim 2, wherein the plurality of circuit elements comprises two or more qubits, and wherein the one or more holes are arranged between the two or more qubits, such that the one or more projections are arranged to pass between adjacent qubits.

5. The superconducting quantum computing circuit package as claimed in claim 1, wherein the surface for receiving the substrate is recessed from a face of the holder.

6. The superconducting quantum computing circuit package as claimed in claim 5, wherein the surface is recessed from the face of the holder by a depth substantially equal to the thickness of the substrate and/or to the height of the one or more projections.

7. The superconducting quantum computing circuit package as claimed in claim 1, wherein the one or more holes correspond in shape and size to the one or more projections, such that the one or more holes receive the corresponding one or more projections when the substrate is on the holder.

8. The superconducting quantum computing circuit package as claimed in claim 1, wherein the one or more projections have a height that is greater than or equal to half the thickness of the substrate.

9. The superconducting quantum computing circuit package as claimed in claim 1, wherein the one or more projections that protrude into the one or more holes in the substrate are arranged to suppress electromagnetic modes having a frequency of less than 12 GHz.

10. A superconducting quantum computing circuit package comprising:
a substrate on which a superconducting quantum computing circuit is formed, wherein the superconducting quantum computing circuit comprises a plurality of circuit elements and the substrate comprises one or more holes arranged between the plurality of circuit elements, wherein the one or more holes extend through a thickness of the substrate; and a holder comprising a surface on which the substrate is received and a cover arranged on an opposite side of the substrate from the holder, wherein the holder and the cover are formed from a metal and/or a superconductor and the holder comprises one or more projections arranged on and projecting from the surface;

wherein the one or more projections protrude through the one or more holes in the substrate and contact the cover so to suppress electromagnetic modes in the frequency range of operation of the quantum computing circuit; and wherein the cover comprises one or more apertures formed through the cover, wherein the quantum computing circuit package comprises one or more wires arranged to pass through the one or more apertures respectively to connect to the quantum computing circuit.

11. The superconducting quantum computing circuit package as claimed in claim 1, wherein cover is spaced from the plurality of circuit elements on the substrate.

12. The superconducting quantum computing circuit package as claimed in claim 1, wherein the cover comprises cut-outs in its surface corresponding to, and facing, the plurality of circuit elements on the substrate.

13. The superconducting quantum computing circuit package as claimed in claim 1, wherein the holder and the cover have been subject to a surface treatment.

14. A superconducting quantum computing circuit package comprising:

a substrate on which a superconducting quantum computing circuit is formed, wherein the superconducting quantum computing circuit comprises a plurality of circuit elements and the substrate comprises one or more holes arranged between the plurality of circuit elements, wherein the one or more holes extend through a thickness of the substrate; and a holder comprising a surface on which the substrate is received and a cover arranged on an opposite side of the substrate from the holder, wherein the holder and the cover are formed from a metal and/or a superconductor and the holder comprises one or more projections arranged on and projecting from the surface;

wherein the one or more projections protrude through the one or more holes in the substrate and contact the cover so to suppress electromagnetic modes in the frequency range of operation of the quantum computing circuit;

wherein the cover comprises one or more depressions corresponding to the one or more projections, wherein the one or more depressions are arranged to receive the one or more projections, such that the one or more projections contact the cover in the corresponding one or more depressions; and wherein the cover comprises a volume of a conducting material in the one or more depressions, wherein the material is softer than the metal of the cover.

\* \* \* \* \*